(12) United States Patent
Hsieh

(10) Patent No.: US 10,998,896 B2
(45) Date of Patent: May 4, 2021

(54) CLOCK DOUBLERS WITH DUTY CYCLE CORRECTION

(71) Applicant: TEXAS INSTRUMENTS INCORPORATED, Dallas, TX (US)

(72) Inventor: Tien-Ling Hsieh, Cedar Park, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/029,366

(22) Filed: Jul. 6, 2018

(65) Prior Publication Data

US 2019/0149141 A1    May 16, 2019

Related U.S. Application Data

(60) Provisional application No. 62/586,290, filed on Nov. 15, 2017.

(51) Int. Cl.
| | |
|---|---|
| *H03K 7/08* | (2006.01) |
| *H03K 17/687* | (2006.01) |
| *G06F 1/08* | (2006.01) |
| *H03B 5/12* | (2006.01) |
| *H03K 19/21* | (2006.01) |
| *G06F 1/10* | (2006.01) |
| *H03B 19/14* | (2006.01) |
| *H03K 5/156* | (2006.01) |
| *H03K 3/017* | (2006.01) |
| *H03K 5/04* | (2006.01) |

(52) U.S. Cl.
CPC .............. *H03K 7/08* (2013.01); *G06F 1/08* (2013.01); *G06F 1/10* (2013.01); *H03B 5/1212* (2013.01); *H03B 5/1215* (2013.01); *H03B 5/1228* (2013.01); *H03B 5/1243* (2013.01); *H03B 19/14* (2013.01); *H03K 3/017* (2013.01); *H03K 5/04* (2013.01); *H03K 5/1565* (2013.01); *H03K 17/687* (2013.01); *H03K 19/21* (2013.01); *H03B 2200/0044* (2013.01)

(58) Field of Classification Search
CPC ........ H03K 7/08; H03K 17/687; H03K 19/21; H03K 17/6871; H03K 17/6872; H03K 17/6874; H03K 5/04; H03K 5/1565; H03K 3/017; H03B 5/1212; G06F 1/08
See application file for complete search history.

(56) References Cited

U.S. PATENT DOCUMENTS 5,760,649 A * 6/1998 Michail ................. H03F 1/3217
330/264
6,060,922 A * 5/2000 Chow ....................... H03K 5/04
327/175

* cited by examiner

*Primary Examiner* — Jung Kim
(74) *Attorney, Agent, or Firm* — Ray A. King; Charles A. Brill; Frank D. Cimino

(57) ABSTRACT

A system for correcting a duty cycle comprises a digital quadrature generator circuit, a frequency doubler circuit, a first duty cycle correction circuit coupled between the digital quadrature generator circuit and the frequency doubler circuit, and a second duty cycle correction circuit coupled between the digital quadrature generator circuit and the frequency doubler circuit. The first duty cycle correction circuit comprises a first stacked duty cycle correction circuit and the second duty cycle correction circuit comprises a second stacked duty cycle correction circuit.

8 Claims, 7 Drawing Sheets

US 10,998,896 B2

CLOCK DOUBLERS WITH DUTY CYCLE CORRECTION

CROSS-REFERENCE TO RELATED APPLICATIONS

The present application claims priority to U.S. Provisional Patent Application No. 62/586,290, which was filed Nov. 15, 2017, is titled "An Open-Loop Clock Doubler with a Simple Duty Cycle Corrector," and is hereby incorporated herein by reference in its entirety.

BACKGROUND

Many integrated circuits (ICs) generate an internal clock signal based on a received clock signal. A number of signal processing, data transfer, and other functions are performed employing the internal clock signal. For example, analog signals can be converted into the digital domain, complex signal processing functions can be performed, digital signals can be stored, and high speed data transfer operations can be performed. The reliable generation of internal clock signals is thus an important aspect of IC design.

SUMMARY

In accordance with at least one example of the disclosure, a system for correcting a duty cycle comprises a digital quadrature generator circuit, a frequency doubler circuit, a first duty cycle correction circuit coupled between the digital quadrature generator circuit and the frequency doubler circuit, and a second duty cycle correction circuit coupled between the digital quadrature generator circuit and the frequency doubler circuit. The first duty cycle correction circuit comprises a first stacked duty cycle correction circuit, and the second duty cycle correction circuit comprises a second stacked duty cycle correction circuit.

In accordance with another example of the disclosure, an apparatus for correcting a duty cycle comprises multiple metal oxide semiconductor (MOS) field effect transistors. The MOS transistors include a first P-channel MOS (PMOS) transistor coupled in series to a second PMOS transistor and a first N-channel MOS (NMOS) transistor coupled in series to a second NMOS transistor. The apparatus also includes an input node coupled to a first gate terminal of the first PMOS transistor and to a first gate terminal of the first NMOS transistor, an output node coupled to each of a second drain terminal of the second PMOS transistor and to a second drain terminal of the second NMOS transistor, a gate node coupled to each of a second gate terminal of the second PMOS transistor and to a second gate terminal of the second NMOS transistor, a positive voltage supply coupled to a first source terminal of the first PMOS transistor, and a ground terminal coupled to the first source terminal of the first NMOS transistor. The input node is configured to receive an input clock signal with a first duty cycle and the output node is configured to generate an output clock signal with a second duty cycle.

In accordance with at least one example of the disclosure, an apparatus for doubling a frequency of a clock signal comprises a first frequency waveshaper circuit that is coupled to a second frequency waveshaper circuit. The first frequency waveshaper circuit is configured to generate a first clock signal at a first frequency. The second frequency waveshaper circuit is configured to receive the first clock signal, filter sub-harmonic spurious signals from the first clock signal, and output a second clock signal at the first frequency.

BRIEF DESCRIPTION OF THE DRAWINGS

For a detailed description of various examples, reference will now be made to the accompanying drawings in which.

DETAILED DESCRIPTION

Figure 1:
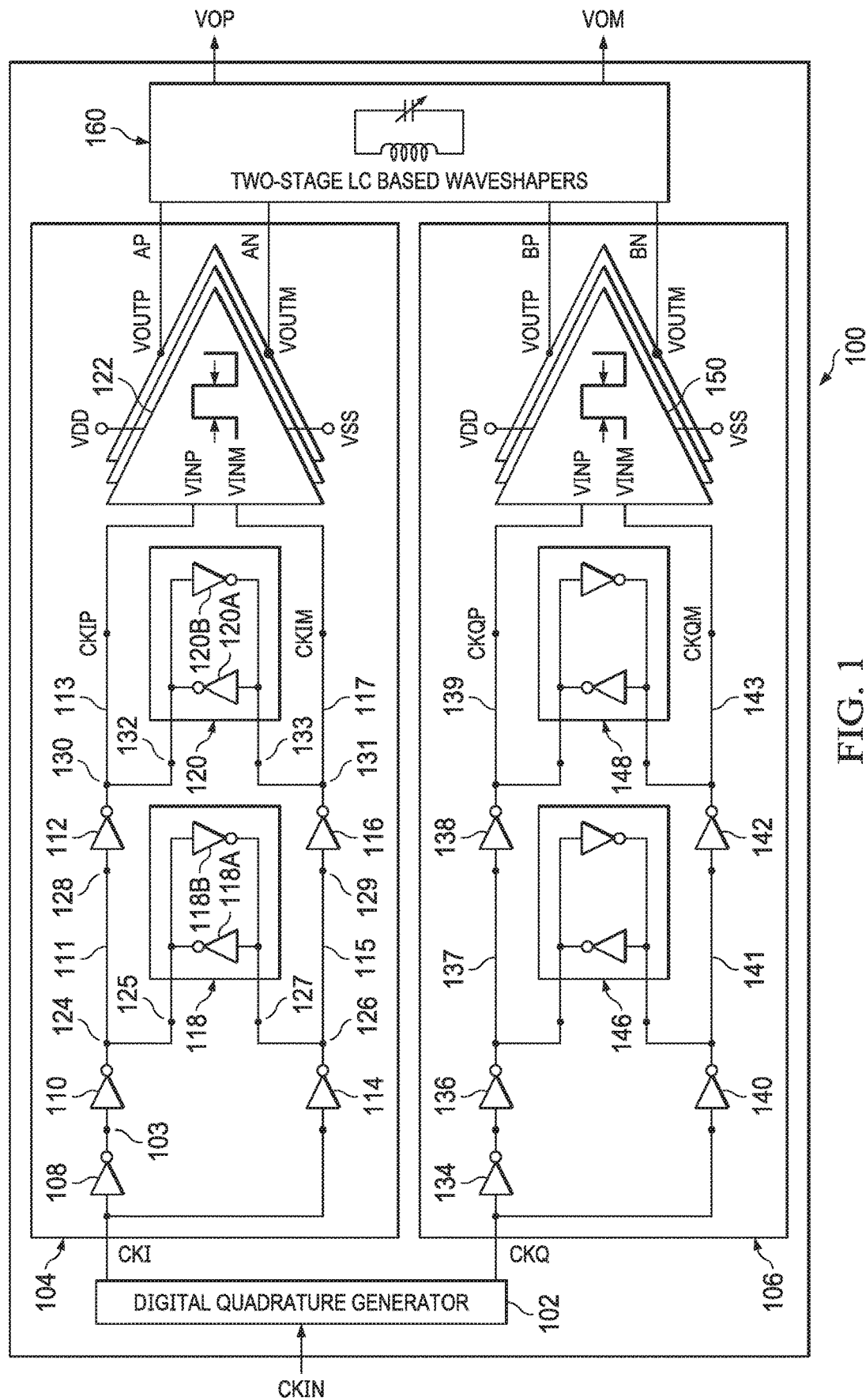
FIG. 1 is a schematic diagram of an illustrative clock doubler circuit in accordance with various examples.

Clock (CLK) signals are used in a variety of circuits. As technology progresses, digital data is processed or transmitted at higher and higher speeds and the conversions between analog and digital signals are done at higher resolutions and higher data rates. To implement faster clock signals that are used to process digital data in high speed analog-to-digital (ADC) applications, a reference clock signal is used. The reference clock signal is typically one-half the frequency of the desired output clock signal ($F_s$) generated within the circuit, which is typically one-half the data rate that is needed for the high-speed ADC application. Generally, the frequency of the reference clock signal is multiplied within a frequency multiplier or doubler circuit in order to generate the desired output clock signal frequency ($F_s$).

Frequency doubler circuits are often implemented using a phase-locked loop (PLL) circuit. A basic PLL circuit for a frequency doubler includes inductor-capacitor (LC) based voltage controlled oscillators (VCO) to generate a reference clock signal. While the PLL circuit can generate a relatively clean output signal at an output clock signal frequency ($F_s$) having a low half-rate sub-harmonic spurious signal (or sub-harmonic spur) at half the output frequency ($F_s/2$), improvement in phase noise of the $F_s$ signal is limited by the VCO. Also, using PLLs in radiation-rich environments such as, for example, in satellite applications and terrestrial radiation applications can detrimentally affect the settling time of a PLL loop. For example, the radiation-rich environment can cause the PLL loop to have a longer settling time or can occasionally cause the PLL loop to go out of lock.

An alternative, non-PLL solution for a radiation-rich environment uses exclusive-OR logic circuits with two clock frequencies having in-phase and quadrature-phase clocks to generate a doubled frequency clock. However, the doubled clock frequency is typically not at 50 percent duty-cycle, which is generally considered to be an ideal clock duty cycle. With a square-wave clock signal, sampling is completed at the rising and falling edges of the square-wave clock signal (hereinafter "zero-crossing"). The rising and falling edges of a square-wave clock signal are used to generate an output signal and, when the square-wave clock signal is not at a 50% duty cycle, the output signal includes a large half-rate spurious signal (Fs/2). Therefore, it is important for the clock to maintain a duty cycle at or near 50%. In addition, the doubled clock frequency can include $F_s/2$ sub-harmonic spurs. By way of example, for an application in a radiation-rich environment where a 2 gigahertz (GHz) output clock is used, a 1 GHz $F_s/2$ sub-harmonic spur is generated that can affect the loop bandwidth of the frequency doubler. To provide a 50% duty-cycle clock, a duty-cycle correction circuit is implemented on the output clock signal to correct its duty cycle. However, the correction is typically suboptimal and can include phase noise. Therefore, a non-PLL clock doubler circuit with a duty cycle correction for generating a frequency doubled clock signal with low phase-noise would be useful for a high speed ADC application in a radiation-rich environment.

Disclosed herein are examples of a clock doubler circuit for generating 50% duty cycle clock signals at an output clock signal frequency $F_s$ that is double the frequency of the reference clock signal that is input to the clock doubler circuit. The clock doubler circuit includes various components, among which are a frequency doubler circuit to double the frequency of the reference clock signal and duty cycle correction circuits, which correct the duty cycle of the output clock signal. In examples, the clock doubler circuit includes multiple stages of duty cycle correction, with each stage providing a partial duty cycle correction to achieve the desired duty cycle correction. Each stage of duty cycle correction includes inverters and cross-coupled inverters that are configured as latches without delay control to provide a pair of complementary clock signals that are 180 degrees out of phase with respect to each other. In addition, to perform duty cycle correction, the clock doubler circuit includes p-type metal oxide semiconductor field effect transistors (PMOS transistors) and n-type metal oxide semiconductor field effect transistors (NMOS transistors) that have a predefined transistor ratio that is configured to generate pull down and pull up currents that are equal when the voltage of the clock signal at each stage is equal to half of a supply voltage VDD. Adjusting the ratio of the PMOS and NMOS transistors makes the pull up or pull down drain currents equal when the voltage of the clock signal at each stage is equal to half the supply voltage VDD. Otherwise, the duty cycle correction will correct to some value that is not equal to 50%. In examples, the clock doubler circuit omits PLL and op-amp components, which undesirably generate noise and cause oscillation and stability problems during operation.

In an example, a frequency doubler circuit is used to generate frequency doubled clock signals from the clock signals that are received from the duty cycle correction circuits. The frequency doubler circuit includes a first stage of a frequency waveshaper that is configured to generate an output clock signal with a doubled frequency $F_s$. In an example, an additional stage of frequency waveshaping is provided in an ADC application for a radiation-rich environment in order to attenuate sub-harmonic $F_s/2$ spurs in the frequency spectrum by 50 dBc when compared to the doubled frequency $F_s$ of the output clock signal so as to achieve at least a 75 dBc spur-free dynamic range (SFDR). In an example, the frequency doubler circuit is controlled by oscillator current Iosc and drive current Idrive, whose ratio can be adjusted to improve phase performance. In an if Idrive is made to be larger than Iosc, the output clock signals from the first stage frequency waveshaper have less noise injection and improved phase noise performance.

The clock doubler circuit provides advantages over conventional solutions. The clock doubler circuit does not use an operation amplifier that requires loop control to generate the frequency doubled signal. Duty cycle errors of the input clock frequency are not affected by the $F_s/2$ clock frequency or waveshaper filtering. As such, the digital quadrature generator can generate quadrature signals that can have a quantization error of approximately 12 picoseconds (ps). The frequency waveshaper uses an injection locked voltage controlled oscillator (VCO), and the resonant frequency of the inductor-capacitor (LC) tank circuit does not have to be precisely matched to the input clock frequency, which allows for wider frequency operation compared to a PLL-based solution.

FIG. 1 is a schematic diagram of an illustrative clock doubler circuit 100 that uses an open-loop solution to generate an output clock signal in accordance with various examples. In an example, the frequency of the output clock signal is double the frequency of a reference clock signal and has a 50% duty-cycle. In an example, clock doubler circuit 100 includes a digital quadrature generator circuit 102, an in-phase duty-cycle correction (DCC) circuit 104, a quadrature-phase DCC circuit 106, and a frequency doubler circuit 160. In some examples, digital quadrature generator circuit 102, DCC circuit 104, DCC circuit 106, and frequency doubler circuit 160 are electrically coupled together by way of wires, metal traces on a printed circuit board, metal routing on a silicon substrate, or any other suitable form of conductive coupling. Clock doubler circuit 100 is implemented, for example, as a standalone device (for example, implemented on its own substrate, enclosed within its own chip package, etc.), or is implemented with other electrical devices in which a frequency doubled clock signal with duty-cycle correction is to be generated.

In an example, digital quadrature generator circuit 102 is electrically coupled to frequency doubler circuit 160 along two parallel paths using DCC circuits 104, 106. In one path, digital quadrature generator circuit 102 is coupled to frequency doubler circuit 160 via DCC circuit 104, and in a second path, digital quadrature generator circuit 102 is coupled to frequency doubler circuit 160 via DCC circuit 106. The DCC circuit 104 is similar to DCC circuit 106 and each DCC circuit 104, 106 processes the signals it receives in a similar manner to produce similar output signals that are shifted in phase.

In an example, digital quadrature generator circuit 102 receives a reference clock signal CKIN at its input from an external source. In some examples, the external source provides the reference clock signal using a quartz crystal oscillator or a voltage controlled crystal oscillator. CKIN is a single-phase clock signal (or a single-ended clock signal) with a frequency $F_s/2$. The digital quadrature generator circuit 102 generates two clock signals, CKI and CKQ, at their outputs that have similar frequencies and amplitudes but that are dissimilar in phase. In an example, the digital quadrature generator circuit 102 generates the CKQ clock signal by a time-to-digital converter (TDC). For example, CKI is an in-phase clock signal, which is referred to as a 0 degree clock signal. CKQ is a quadrature-phase clock signal that is 90 degrees out of phase relative to CKI. In one example, CKI and CKQ are nominally spaced apart by 90 degrees (CKI and CKQ are out of phase by one-quarter clock period). In other examples, CKI and CKQ are 80 degrees or 70 degrees out of phase relative to each other, or they have some other phase offset.

In one example, clock signal CKI is inputted into DCC circuit 104. In an example, DCC circuit 104 includes a 3-stage inverter chain or buffer inverters 108, 110, and 112 that are arranged along a first path from buffer inverter 108 to a stacked duty cycle correction circuit 122, a 2-stage inverter chain or buffer inverters 114 and 116 that are arranged along a second path from inverter 114 to stacked duty cycle correction circuit 122, a latch 118 coupled across leads 111 and 115, and a latch 120 coupled across leads 113 and 117. Inverter 108 is coupled to inverter 110, and inverter 110 is coupled to inverter 112 along the first path. Inverter 114 is coupled to inverter 116 along the second path. Latch 118 includes cross-coupled inverters 118A and 118B that are coupled across leads 111 and 115. Latch 120 includes cross-coupled inverters 120A and 120B that are coupled across leads 113 and 117.

In an example, DCC circuit 104 receives clock signal CKI at inputs to inverters 108 and 114. The output clock signal 103 from inverter 108 is an inverted signal that is complementary to clock signal CKI. As used in this disclosure, a differential or complementary clock signal is a clock signal that is 180 degrees out of phase with another clock signal. Output clock signal 103 is inputted to inverter 110 along the first path. Inverter 110 generates a clock signal 124 at lead 111 that is complementary to clock signal 103. Inverter 114 generates a clock signal 126 at lead 115 that is complementary to clock signal CKI. Also, each inverter 108, 110, and 114 adds a time-delay to clock signal CKI as clock signal CKI propagates through each inverter 108, 110, and 114 along the first and the second paths. Clock signal 124 is generally a differential or complementary signal to clock signal 126.

The clock signals 124, 126 are inputted into the latch 118. For example, clock signal 124 is inputted to inverter 118A of latch 118, while clock signal 126 is inputted to inverter 118B of latch 118. The cross-coupled inverters 118A and 118B are configured to generate clock signals 125 and 127 at respective leads 111 and 115. Latch 118 is configured to provide clock signals at leads 111 and 115 that are approximately 180 degrees out of phase relative to each other. For example, clock signals 125, 127 with their respective zero-crossings (or a change in polarity of the clock signal) have a duty cycle that is closer to a 50% duty cycle than clock signal CKI. In order to ensure that clock signals 125, 127 at respective leads 111, 115 are complementary, inverters 110 and 114 have stronger driving strengths than the driving strengths of cross-coupled inverters 118A and 118B in latch 118. The stronger driving strengths of the cross-coupled inverters 118A and 118B prevent clock signals 124 and 126 from being latched to a static voltage. Also, latch 118 maintains a better zero-crossing of clock signals 125 and 127 than the respective zero-crossing of clock signals 124 and 126.

In an example, the clock signal 128 at lead 111 includes both clock signals 124 and 125. In an example, the clock signal 128 has a phase with a zero-crossing in the middle of the zero-crossing of signal 124 and zero-crossing of signal 125. For example, the rising edge of clock signal 128 is in the middle of the rising edge of input signal 124 and the rising edge of output signal 125 or the falling edge of clock signal 128 is in the middle of the falling edge of input signal 124 and the falling edge of output signal 125. The zero-crossing of clock-signal 128 thereby improves the duty cycle of the input signal 124 at lead 111 to move the clock signal towards a 50% duty cycle. Similarly, clock signal 129 at lead 115 includes clock signal 126 and clock signal 127. The clock signal 129 has a zero-crossing at the middle of the zero-crossing of signal 126 and the signal 127. For example, the rising edge of clock signal 129 is in the middle of the rising edge of signal 126 and the rising edge of signal 127, or the falling edge of clock signal 129 is in the middle of the falling edge of signal 126 and the falling edge of signal 127. As such, latch 118 improves the duty cycles of differential clock signals 128, 129 to move the clock signal 129 towards a 50% duty cycle.

Clock signal 128 at lead 111 is inputted into inverter 112, while clock signal 129 at lead 115 is inputted into inverter 116. Inverters 112 and 116 are coupled to latch 118 at their inputs and to latch 120 at their outputs. Inverters 112 and 116 generate inverted clock signals 130, 131 at their respective outputs. Clock signals 130, 131 are inputted into latch 120. Latch 120 is configured to operate in substantially the same manner as latch 118. For example, latch 120 receives clock signals 130, 131 and generates clock signals CKIP, CKIM. Clock signal CKIP has a complementary phase with respect to CKIM, so that CKIM is 180 degrees out of phase with clock signal CKIP. Each clock signal CKIP, CKIM deviates at various percentages from a 50% duty cycle. However, these clock signals CKIP, CKIM have a zero crossing at the middle of the rising and falling edges of clock signals 130 and 132. In examples, CKIP is at a 30% duty cycle (with CKIM at a 70% duty cycle), are at a 70% duty cycle (with CKIM at a 30% duty cycle), or are at another duty cycle. The deviation of clock signals CKIP, CKIM from a 50% duty cycle is due to propagation delays by the inverters 108, 110, 112, 114, and 116 as the clock signal CKI propagates from digital quadrature generator circuit 102 through DCC 104 and to stacked duty cycle correction circuit 122. For example, logic elements can have an asymmetric response to rising and falling waveforms, so that the propagation delay through latch 120 and other logic elements differs for rising and falling edges. The clock signal propagating through the logic element is either shortened or lengthened by this difference in propagation delay. This deviation in duty cycle can be corrected through device parametric matching in these logic elements. In an example, clock signal CKIP has a phase with a zero-crossing in the middle of the clock signals 130 and 132, thereby improving the zero-crossing of clock signal CKIP. Similarly, clock signal CKIM has a phase with a zero-crossing at the middle of the zero-crossing of clock signals 131, 133.

Figure 5:
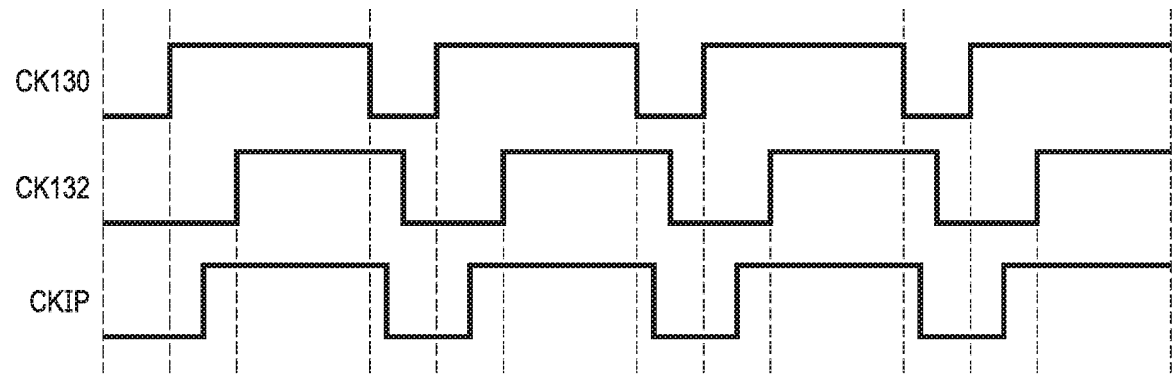
FIG. 5 is a waveform diagram illustrating operation of a latch of FIG. 1 in accordance with various examples.

FIG. 5 is a waveform diagram illustrating operation of latch 120 in accordance with various examples. In an example, clock signal CK130 is the output clock signal from inverter 112 and clock signal CKIP is the output clock signal. As is shown in FIG. 5, the rising edge of clock signal CKIP is in the middle of the rising edge of clock signal CK130 and the rising edge of clock signal CK132, and the falling edge of clock signal CKIP is in the middle of the falling edge of clock signal CK130 and the falling edge of clock signal CK132.

As such, latch 120 improves the phases of differential clock signals CKIP and CKIM such that clock signals CKIP and CKIM are approximately 180 degrees out of phase with respect to each other (clock signals CKIP and CKIM are complementary clock signals). For generation of a double clock frequency $F_s$, complementary clock signals are used in an exclusive-OR circuit in a frequency doubler circuit 160. In an example, clock signal CKIP is a 0 degree clock signal and is complementary to clock signal CKIM where clock signal CKIP is approximately 180 degrees out of phase with clock signal CKIP.

Stacked duty cycle correction circuit 122 is coupled to latch 120 and receives clock signals CKIP, CKIM at its input. Stacked duty cycle correction circuit 122 is configured to generate duty-cycle corrected clock signals AP and AN. In an example, stacked duty cycle correction circuit 122 receives clock signals CKIP, CKIM at its input and outputs duty-cycle corrected clock signals AP and AN. In an example, AP and AN are complementary clock signals such as, for example, 0 degree clock signals and 180 degree clock signals where each clock signal AP, AN has a duty cycle of approximately 50%.

In examples, DCC circuit 106 receives clock signal CKQ from quadrature generator circuit 102 and generates duty-cycle corrected clock signals BP and BN at its output. In an example, DCC circuit 106 includes substantially similar circuits as DCC circuit 104 that operate in substantially the same manner as DCC circuit 104 and processes the input signal CKQ in substantially the same manner as the DCC circuit 104 processes input signal CKI to produce output signals BP and BN that are shifted in phase relative to each other. In an example, DCC circuit 106 includes a 3-stage inverter chain or buffer inverters 134, 136, and 138 that are arranged along a first path from buffer inverter 134 to a stacked duty cycle correction circuit 150, a 2-stage inverter chain or buffer inverters 140 and 142 that are arranged along a second path from inverter 140 to stacked duty cycle correction circuit 150, a latch 146 coupled across leads 137 and 141, and a latch 148 coupled across leads 139 and 143. In an example, DCC 106 receives the quadrature-phase clock signal CKQ and generates clock signals CKQP, CKQM. Clock signals CKQP, CKQM are generated in a similar manner and are similar to clock signals CKIP, CKIM, respectively. Also, clock signal CKQP is complementary to clock signal CKQM. Stacked duty cycle correction circuit 150 receives clock signals CKQP, CKQM at its input and outputs duty-cycle corrected clock signals BP and BN. In an example, BP and BN are complementary clock signals such as, for example, 90 degree clock signals and 270 degree clock signals where each clock signal BP, BN has a duty cycle of approximately 50%. The DCC circuit 104 and DCC circuit 106 operate in a similar manner such that output clock signals AP, AN from DCC circuit 104 have similar duty cycles as the output clock signals BP, BN from DCC 106, but they are approximately spaced apart by 90 degrees (for example, output clock signals AP and BP are approximately 90 degrees out of phase with each other and output clock signals AN and BN are approximately 90 degrees out of phase with each other).

In an example, frequency doubler circuit 160 is coupled to each of DCC circuits DCC 104 and DCC 106. In an example, frequency doubler circuit 160 receives output clock signals AP and AN from DCC 104, and clock signals BP and BN from DCC 106. The frequency doubler circuit 160 includes a voltage controlled oscillator VCO (shown in FIG. 4 below). The VCO receives clock signals AP, AN, BP, and BN and generates internal clock signals that are at a frequency of output dock signal ($F_5$). The internal clock signals are further processed to filter the signals for $F_s/2$ sub-harmonic spurs while providing output clock signals VOP and VOM that are complementary clock signals and have a frequency that is double the frequency of the input clock signal CKIN with low phase noise.

Figure 6:
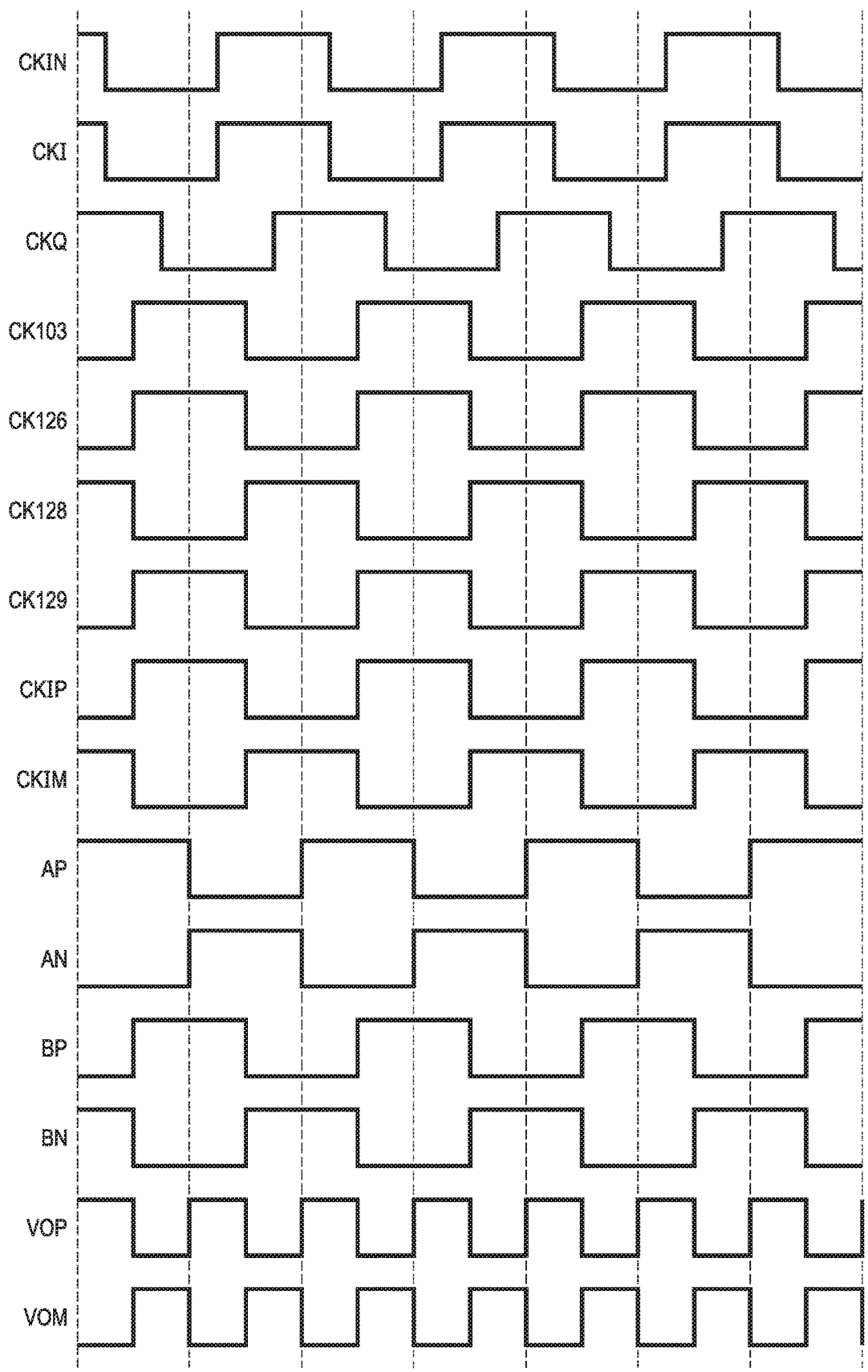
FIG. 6 is a waveform diagram for the illustrative clock doubler circuit of FIG. 1 in accordance with various examples.

FIG. 6 is a waveform diagram illustrating operation of the clock doubler circuit of FIG. 1 in accordance with various examples. In an example, CKIN is the reference clock signal with a frequency that is one-half the signal frequency of $F_s$. Clock signals CKI and CKQ are outputted from quadrature signal generator circuit 102 and are 90 degrees out of phase with each other. CK103 is an output signal of buffer inverter 108 and CK126 is an output signal of buffer inverter 114. CK103 and CK126 have the same phase (zero-crossing) and similar duty cycles. CK128 and CK129 are output clock signals of latch Clock signals CKIP and CKIM are output from latch 120 and are 180 degrees out of phase (for example, complementary) with respect to each other. Corrected clock signal AP is a duty-cycle corrected clock signal that is approximately 50% duty cycle. Corrected clock signal AN is a duty-cycle corrected clock signal that is approximately 50% duty cycle. In an example, AP and AN are 180 degrees out of phase. Similarly, corrected clock signals BP and BN are 50% duty-cycle clock signals and are 180 degrees out of phase with respect to each other. Signals VOP and VOM are complementary.

Figure 2:
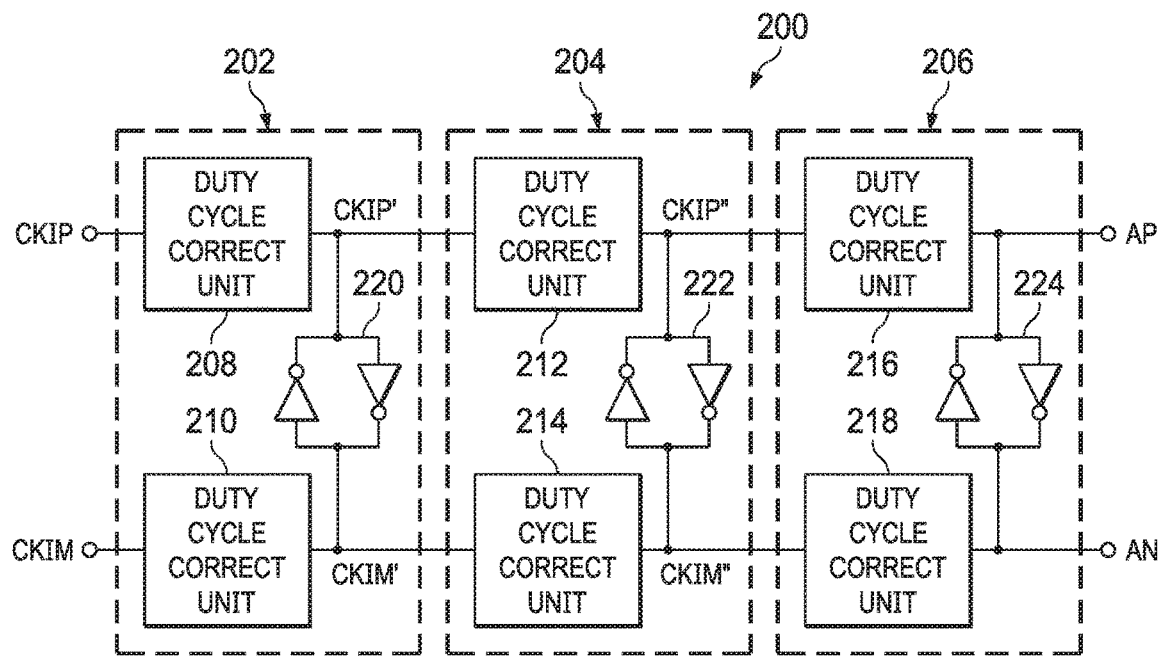
FIG. 2 is a schematic diagram of an illustrative duty cycle correction circuit of the clock doubler circuit of FIG. 1 in accordance with various examples.

FIG. 2 illustrates a schematic diagram of an illustrative stacked duty cycle correction circuit 200 that is configured to generate differential output clock signals with a 50% duty cycle. In examples, stacked duty cycle correction circuit 200 is stacked duty cycle correction circuit 122 and/or stacked duty cycle correction circuit 150. For purposes of brevity, a discussion of stacked duty cycle correction circuit 200 will be made with reference to stacked duty cycle correction circuit 122. The discussion also applies, however, to stacked duty cycle correction circuit 150.

As shown in FIG. 2, stacked duty cycle correction circuit 200 includes multiple, substantially similar duty cycle correction sub-circuits 202, 204, and 206. Each duty cycle correction sub-circuit 202, 204, and 206 operates in substantially the same manner and is configured to provide partial duty cycle correction to received clock signals in accordance with various examples. Chaining together the duty cycle correction sub-circuits 202, 204, 206 provides a serial operation for correcting or partially correcting clock signals that have been partially corrected in a previous stage. In some examples, additional correction sub-circuits are coupled in series to the correction sub-circuit 206 to provide additional duty cycle correction. In an example, duty cycle correction sub-circuit 202 corrects or partially corrects the duty cycles of differential clock signals CKIP, CKIM. The corrected or partially corrected duty cycle clock signals CKIP, CKIM are then provided to duty cycle correction sub-circuits 204 for additional partial correction of the duty cycle. For example, duty cycle correction sub-circuit 204 partially corrects the duty cycles of input signals CKIP', CKIM' that are received at respective inputs and provides respective duty cycle corrected or partially corrected clock signals CKIP", CKIM" to duty cycle correction sub-circuit 206 for additional duty cycle correction. Duty cycle correction sub-circuit 206 partially corrects the duty cycles of input signals CKIP", CKIM'" and outputs respective duty cycle corrected clock signals AP, AN. In operation, each stage of duty cycle correction such as, for example, duty cycle correction sub-circuits 202, 204, and 206 is configured to correct or partially correct a duty cycle of a received differential clock signal and generate complementary or differential output clock signals that are closer to a 50% duty cycle than the received signals. FIG. 6 depicts an illustrative timing diagram of output clock signals from stacked duty cycle correction unit 200.

Referring back to FIG. 2, in an example, duty cycle correction sub-circuit 202 includes a duty cycle correction unit 208, a duty cycle correction unit 210, and a latch 220. Latch 220 is coupled to duty cycle correction unit 208 at one end and to duty cycle correction unit 210 at its opposite end. Duty cycle correction unit 208 receives clock signal CKIP and outputs a corrected or partially corrected clock signal CKIP'. Duty cycle correction unit 210 receives clock signal CKIM and outputs a corrected or partially corrected clock signal CKIM'. In an example, the duty cycle corrected clock signals CKIP', CKIM' are closer to a 50% duty cycle than the duty cycles of clock signals CKIM and CKIP. The partially corrected duty cycle clock signals CKIP', CKIM' are inputted into latch 220. Latch 220 receives the clock signals CKIP', CKIM' and outputs clock signals that improve the phases of clock signals CKIP', CKIM' to make the clock signals 180 degrees out of phase with respect to each other. This phase offset provides an advantage of removing delay between signals as approximately complementary signals (clock signals AP, AN) are needed by the frequency doubler circuit 160 of FIG. 1.

In an example, duty cycle correction sub-circuit 204 is coupled to duty cycle correction sub-circuit 202 and receives the differential clock signals CKIP', CKIM' at its input. In an example, duty cycle correction sub-circuit 204 includes similar components as duty cycle correction unit 202. In an example, duty cycle correction sub-circuit 204 includes duty cycle correction unit 212, a duty cycle correction unit 214, and latch 222. Latch 222 is coupled to duty cycle correction unit 212 at one end and to duty cycle correction unit 214 at its opposite end. In an example, duty cycle correction sub-circuit 204 provides an additional stage of duty cycle correction on differential clock signals CKIP', CKIM' to generate clock signals CKIP", CKIM" with a duty cycle that is nearer to a 50% duty cycle than the duty cycle of clock signals CKIP', CKIM' while maintaining these differential clock signals CKIP", CKIM" approximately 180 degrees out of phase.

Duty cycle correction sub-circuit 204 outputs the corrected clock signals CKIP", CKIM" to duty cycle correction sub-circuit 206. Duty cycle correction sub-circuit 206 is substantially similar to duty cycle correction sub-circuit 202 and duty cycle correction sub-circuit 204, and includes similar components as duty cycle correction sub-circuits 202, 204. In an example, duty cycle correction sub-circuit 206 includes a duty cycle correction unit 216, a duty cycle correction unit 218, and latch 224. Latch 224 is coupled to duty cycle correction unit 216 at one end and to duty cycle correction unit 218 at its opposite end. Duty cycle correction sub-circuit 206 is configured to provide an additional stage of duty cycle correction on clock signals CKIP", CKIM" and outputs duty-cycle corrected clock signals AP and AN. Clock signals AP and AN are 50% duty cycle clock signals and are generally 180 degrees out of phase with respect to each other. For example, clock signal AP is a 0 degree clock signal with a 50% duty cycle and clock signal AN is a 180 degree clock signal with a 50% duty cycle. Alternatively, if input signals CKQP and CKQM (see FIG. 1) are received, clock signal BP is a 90 degree clock signal with a 50% duty cycle and clock signal BN is a 270 degree clock signal with a 50% duty cycle. The duty cycle correction sub-circuits 202, 204, 206 provide duty cycle correction of clock signals that are received at their respective inputs, and stacking the duty cycle correction sub-circuits 202, 204, 206 serially corrects the differential input clock signal through each duty cycle correction sub-circuit 202, 204, 206 such that output clock signals AP, AN, BP, and BN are 50% duty cycle clock signals.

Figure 7:
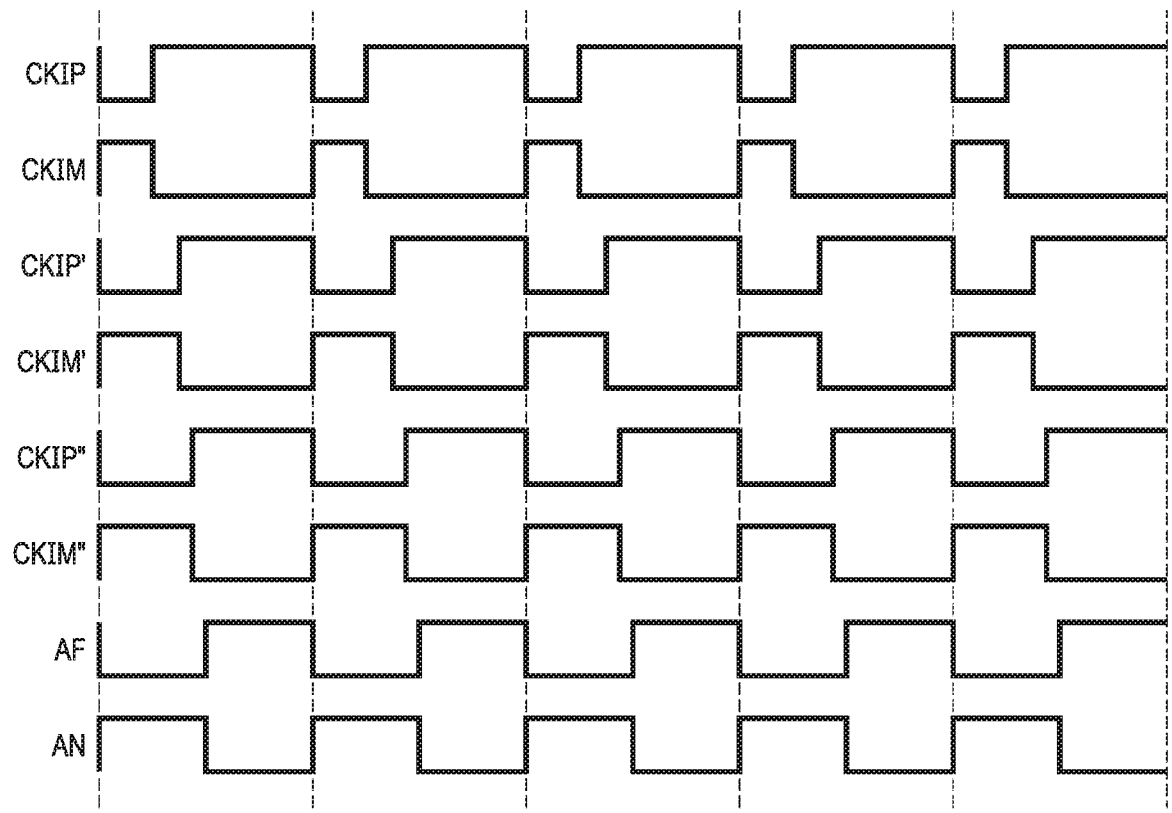
FIG. 7 is an illustrative timing diagram for the stacked duty cycle correction circuit of FIG. 2. in accordance with various examples.

FIG. 7 is a waveform diagram illustrating operation of the stacked duty cycle correction circuit 200 of FIG. 2 in accordance with various examples. In an example, clock signals CKIP and CKIM are complementary signals that are 180 degrees out of phase with respect to each other. Clock signals CKIP and CKIM are not ideal 50% duty cycle clock signals with clock signal CKIP being approximately a 75% duty cycle clock signal and clock signal CKIM being a 25% duty cycle clock signal. Partially corrected clock signals CKIP' and CKIM' have duty cycles that are closer to a 50% duty cycle. For example, clock signal CKIP' is a 65% duty cycle clock signal and clock signal CKIM' is a 35% duty cycle clock signal. Clock signals CKIP" and CKIM" are partially corrected clock signals and, in examples, clock signal CKIP" is a 55% duty cycle clock signal and clock signal CKIM'" is a 45% duty cycle clock signal. Corrected clock signals AP and AN are partially corrected clock signals that are at approximately 50% duty cycle. AP and AN are 180 degrees out of phase.

Figure 3:
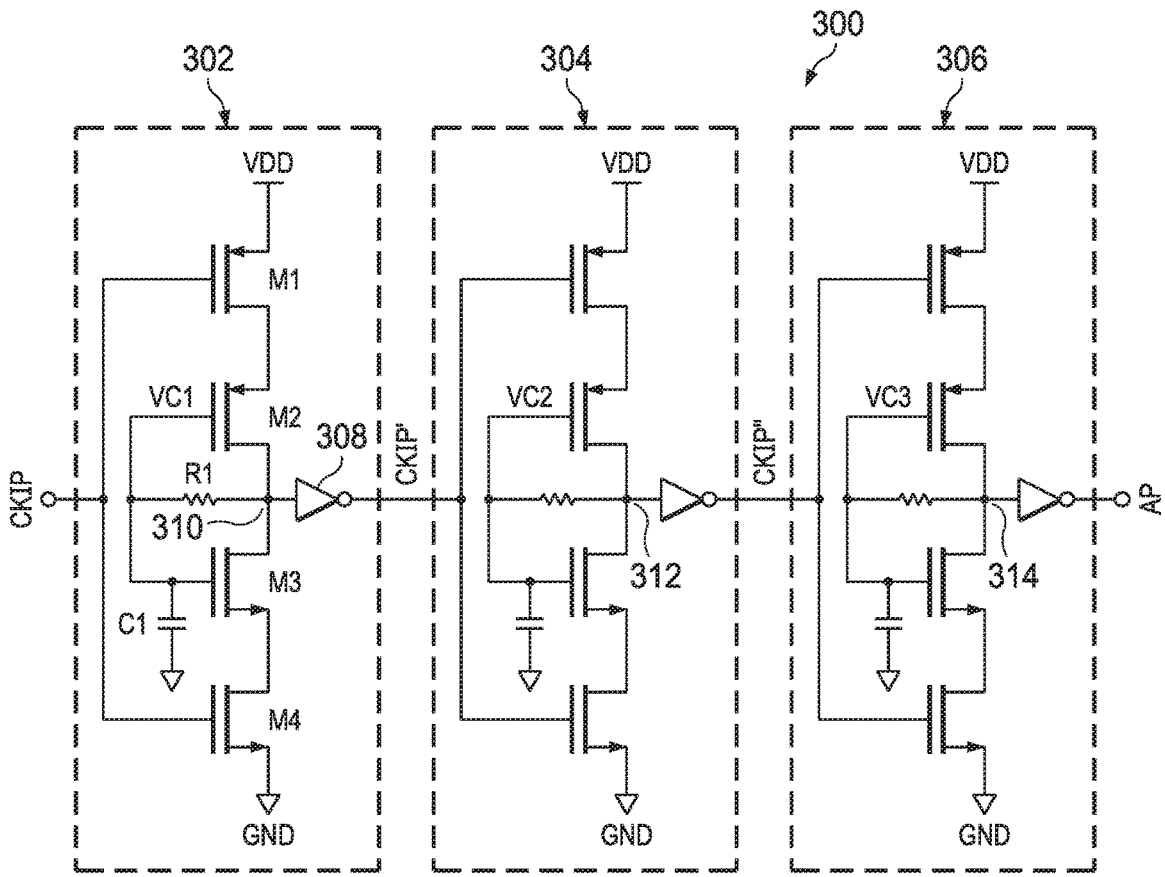
FIG. 3 is a circuit diagram of an illustrative duty cycle correction circuit of FIG. 2 in accordance with various examples.

FIG. 3 is a circuit diagram 300 that depicts duty cycle correction units 302, 304, and 306 in detail. In examples, the duty cycle correction units 302, 304, and 306 are the duty cycle correction units 208, 212, and 216, respectively or the duty cycle correction units 210, 214, and 218, respectively. For purposes of brevity, a discussion of the duty cycle correction units 302, 304, and 306 will be made with reference to duty cycle correction units 208, 212, and 216 of FIG. 2, although the discussion also applies to the duty cycle correction units 210, 214, and 218. The duty cycle correction units 304 and 306 include substantially the same components as duty cycle correction unit 302 and operate in a similar manner to the duty cycle correction unit 302. Thus, a discussion of duty cycle correction unit 302 applies to the duty cycle correction units 304 and 306.

In an example, duty cycle correction unit 302 comprises transistors M1, M2, M3, and M4 that are coupled in series. In examples, transistors M1 and M2 are P-channel metal oxide semiconductor field effect transistors (PMOS), and transistors M3 and M4 are N-channel metal oxide semiconductor field effect transistors (NMOS). Duty cycle correction unit 302 includes an inverter 308, a positive voltage supply VDD, a resistor R1, a ground terminal GND, and a bypass capacitor C1 coupled to GND. In an example, the positive voltage supply VDD is supplied to the source terminal of transistor M1, a clock signal CKIP is supplied to the gate terminal of transistor M1 and transistor M4, and the drain terminal of transistor M1 is coupled to the source terminal of transistor M2. The drain terminal of transistor M2 is coupled to the drain terminal of transistor M3, to the input of inverter 308, and to a first node 310 of resistor R1. The second node of resistor R1 is coupled to the gate terminals of transistor M2 and transistor M3 and to capacitor The source terminal of transistor M3 is coupled to the drain terminal of transistor M4, and the source terminal of M4 is coupled to ground node GND. Capacitor C1 is a bypass capacitor that is coupled between a positive voltage supply VC1 and ground node GND, where VC1 is a gate voltage applied to the gate terminals of transistors M2 and M3.

In an example, transistors M1 and M4 are configured as switches that are switched ON and OFF from high and low voltage amplitudes of clock signal CKIP. In an example, applying a low voltage amplitude to gate terminal of transistor M1 switches transistor M1 ON and couples transistor M2 to voltage supply VDD. In another example, applying high voltage amplitude to transistor M4 ON switches transistor M4 ON and couples transistor M3 to ground node GND. Also, in an example, transistors M2 and M3 are designed with specific sizing (width-by-length) ratios that control the drain currents flowing through transistors M2 and M3 when they are controlled to be ON using bias voltage VC1. Duty cycle correction units 304 and 306 are substantially similar in structure and operation to duty cycle correction unit 302, and voltage VC2 is an average voltage of node 312 (VDD/2) and voltage VC3 is an average voltage of node 314 (VDD/2). The voltage of VC1 is the average voltage of node 310 (for example, VDD/2) with a voltage drop across resistor R1.

In an example, voltage VC1 is a gate bias voltage to transistors M2 and M3. Voltage VC1 is a function of the clock signal CKIP, as explained below, and has a direct current (DC) value of VDD/2 at steady state. In examples, the transistor sizing ratio of transistors M2 and M3 are set in order to make the pull down current through transistor M3 and pull up current through transistor M2 equal when the voltage VC1, VC2, and VC3 at respective gate terminals in units 302, 304, and 306 are equal to VDD/2. When the voltages at VC1-VC3 are not equal to VDD/2, the duty cycle correction will be a value that is not equal to 50% and will continue to be partially corrected towards a 50% duty cycle in each of the duty cycle correction units 302, 304, 306. The duty cycle correction is explained in further detail below. The capacitor C1 is configured to operate as a charge pump that is controlled by transistors M2 and M3.

In examples, applying either a low or high duty-cycle clock signal CKIP at the gate terminals of transistors M1 and M4 either turns ON or turns OFF switches M1 and M4. In an example, voltage bias VC1 determines whether a larger pull up current flows through transistor M2 (at node 310) or a larger pull down current flows through transistor M3 (at node 310). In an example, pull up and pull down currents adjust the increase or decrease in rise and fall times of the input clock signal CKIP. For example, if voltage bias VC1 has a high DC voltage, transistor M3 is stronger with respect to transistor M2 (transistor M2 is weaker), and a pull down current through transistor M3 is stronger than the pull up current through M2, thereby causing a partial correction in the duty cycle at node 310 (for example, reducing the duty cycle of clock signal at node 310). When DC voltage VC1 is low, transistor M2 is stronger with respect to transistor M3 (transistor M3 is weaker), and the pull up drain current through transistor M2 is stronger than the pull down current through M3, thereby causing a partial correction in the duty cycle at node 310 (for example, increasing the duty cycle of clock signal at node 310).

Figure 9:
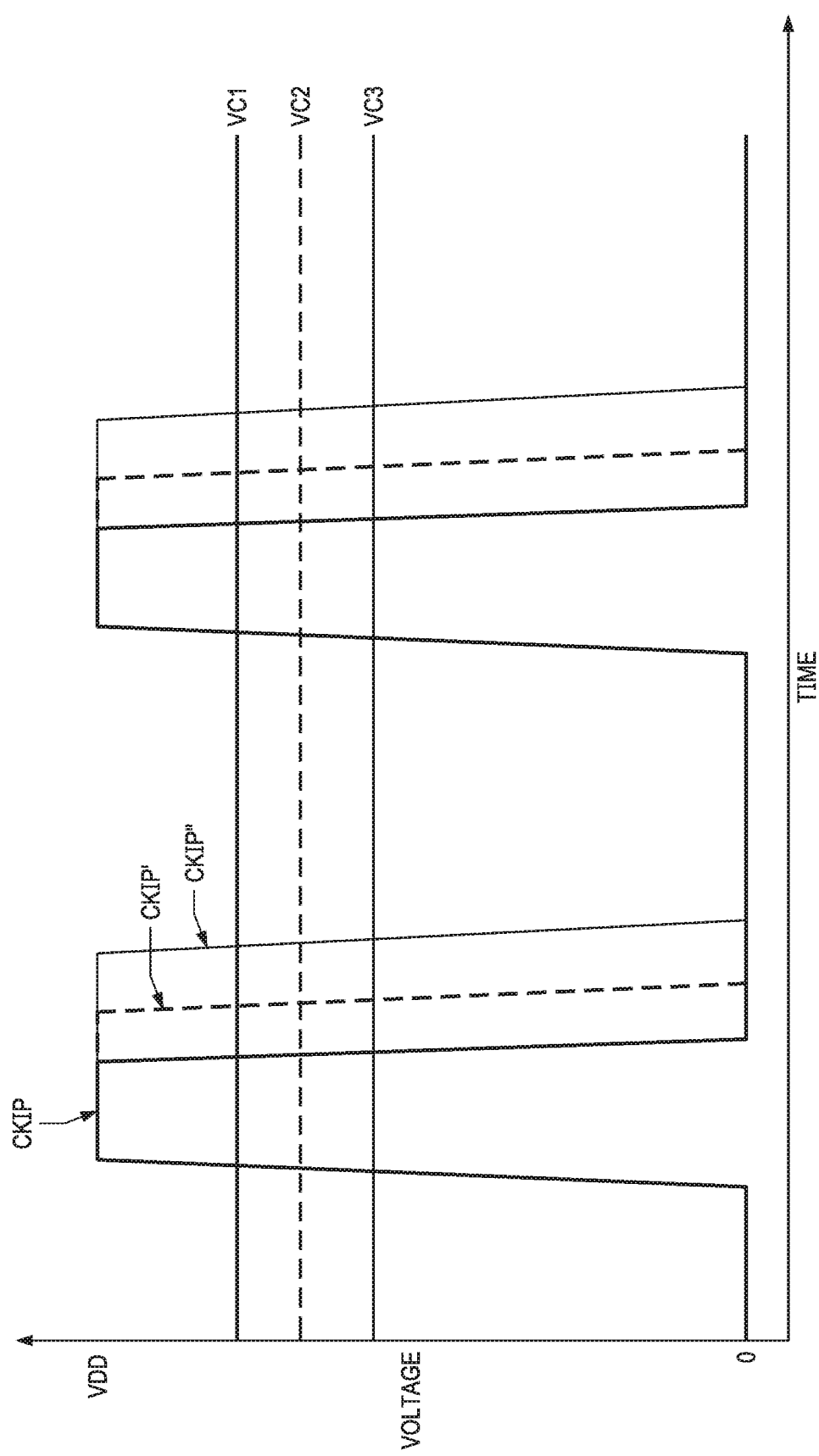
FIG. 9 is a waveform diagram illustrating operation of a duty cycle correction circuit of FIG. 2 in accordance with various examples.

FIG. 9 is a waveform diagram illustrating operation of the duty cycle correction units of circuit diagram 300 in accordance with various examples. In an example, clock signal CKIP is an input clock signal to duty cycle correction unit 302, CKIP' is an output clock signal from duty cycle correction unit 302 that is input to duty cycle correction unit 304, and CKIP" is an output clock signal from duty cycle correction unit 304. As is shown in FIG. 9, clock signal CKIP is a low duty cycle clock signal that has less than a 50% duty cycle. Each duty cycle correction unit outputs a partially-corrected clock signal. For example, duty cycle correction unit 302 partially corrects input clock signal CKIP and outputs a partially-corrected clock signal CKIP' that has an improved duty cycle over clock signal CKIP. Duty cycle correction unit 304 receives clock signal CKIP' and outputs a partially-corrected clock signal CKIP" that is about a 50% duty cycle. Control voltages VC1, VC2, and VC3 are also illustrated for controlling the duty cycle correction units.

In operation, for example, a low duty-cycle clock signal CKIP is applied to duty cycle correction unit 302 causing transistor M1 to be switched ON during a low duty-cycle value of the clock signal CKIP and transistor M4 to be switched ON during a high duty-cycle value of clock signal CKIP. In an example of the low duty-cycle clock signal CKIP when transistor M1 is ON, the initial value for voltage VC1 is VDD due to a thin gate oxide layer of transistor M2. M1 current is larger than M4 due to a low duty-cycle of clock signal CKIP. VDD turns transistor M3 ON and a drain leakage current flows from node 310 to ground causing node 310 to have a lower voltage DC value. This DC value of node 310 will be read out to VC1 through R1C1, causing VC1 to go lower than VDD. As voltage VC1 goes lower, the pull up current of M2 goes higher while the pull down current of M3 goes smaller until the pull up (M1 in series with M2) and pull down (M3 in series with M4) currents equalize. In examples, a low duty-cycle clock signal CKIP causes a high duty-cycle signal on node 310. The voltage at node 310 applies a feedback (DC) voltage VC1 through resistor R1C1 to the gate terminals of transistors M2 and M3 of duty cycle correction unit 302. The feedback voltage VC1 is a high voltage, resulting in a weaker pull up current through transistor M2, reducing the duty cycle at node 310 and increasing the duty cycle of clock signal CKIP'. Thus, feedback voltage VC1 improves the duty cycle at clock signal CKIP' (for example, duty cycle of clock signal at node 310 is closer to a 50% duty cycle) when compared to clock signal CKIP. In an example, as the duty cycle of the clock signal CKIP approaches a 50% duty cycle and the value of voltage bias VC1 approaches VDD/2, the pull down and pull up currents equalize.

In an example, when a low duty cycle clock signal is applied as a clock signal CKIP, the pull up current of transistor M2 is higher than the pull down current transistor M3, which makes the duty-cycle of the output signal CKIP' larger than the duty cycle of clock signal CKIP. For example, if clock signal CKIP has a low duty cycle, voltage bias VC1 is low, which makes transistor M3 weaker (for example, smaller drain current), thus decreasing the fall time of the negative edge of clock signal CKIP and transistor M2 to be stronger (for example, larger drain current), thus increasing the rise time for positive edge of clock signal CKIP. A low duty cycle clock signal CKIP enhances pull up and makes pull down slower in order to adjust the duty cycle of clock signal CKIP to make the duty cycle of the clock signal on node 310 larger than the duty cycle of clock signal CKIP and closer to a 50% duty cycle.

Conversely, if clock signal CKIP has a high duty cycle, the voltage of VC1 is causing transistor M2 to be weaker (for example, smaller drain current) and M3 to be stronger (for example, larger drain current). A high duty cycle clock signal CKIP enhances pull down, decreasing the fall time of the negative edge of clock signal CKIP, and makes pull up slower, increasing the rise time of the negative edge of clock signal CKIP. This change in rise and fall times adjusts the duty cycle of the clock signal on node 310 to be smaller than the duty cycle of clock signal CKIP and closer to a 50% duty cycle. (As used herein, a low duty cycle clock signal is a clock signal with less than 50% duty cycle and a high duty cycle clock signal is a clock signal with greater than 50% duty cycle.) The clock signal at node 310 is inverted by inverter 308, which outputs clock signal CKIP'. Inverter 308 does not affect the duty cycle of clock signal CKIP' but increases its slew rate. Duty cycle correction unit 302 performs a partial duty cycle correction of clock signal CKIP. The clock signal CKIP' is outputted to a second stage of duty cycle correction at the duty cycle correction unit 304. Duty cycle correction unit 304 is substantially similar to duty cycle correction unit 302 and operates to adjust the duty cycle of the clock signal CKIP' to a clock signal CKIP" that has a duty cycle that is closer to a 50% duty cycle than CKIP'. Similarly, output clock signal CKIP" is outputted to a third stage of duty cycle correction at duty cycle correction unit 306. Duty cycle correction unit 306 is substantially similar to duty cycle correction units 302 and 304 and adjusts the duty cycle of the clock signal CKIP" to produce a clock signal AP that has a duty cycle that is closer to a 50% duty cycle than CKIP". In this way, the duty cycle correction units 302, 304, and 306 are configured to correct the duty cycle of the input clock signal and output a clock signal with a duty cycle that is closer to 50% than the input clock signal that is received at the respective duty cycle correction unit 302, 304, and 306. In some examples, assuming that clock signal CKIP has a 30% duty cycle, clock signal CKIP' has about a 40% duty cycle, clock signal CKIP" has about a 45% duty cycle, and clock signal AP has about a 49% duty cycle. The frequency of output clock signal AP is $F_s/2$ that has a predefined phase. In an example, additional duty cycle correction units that are substantially similar to duty cycle correction units 302, 304, and 306 are added to correct the duty cycle of the clock signal to a higher precision.

Figure 4:
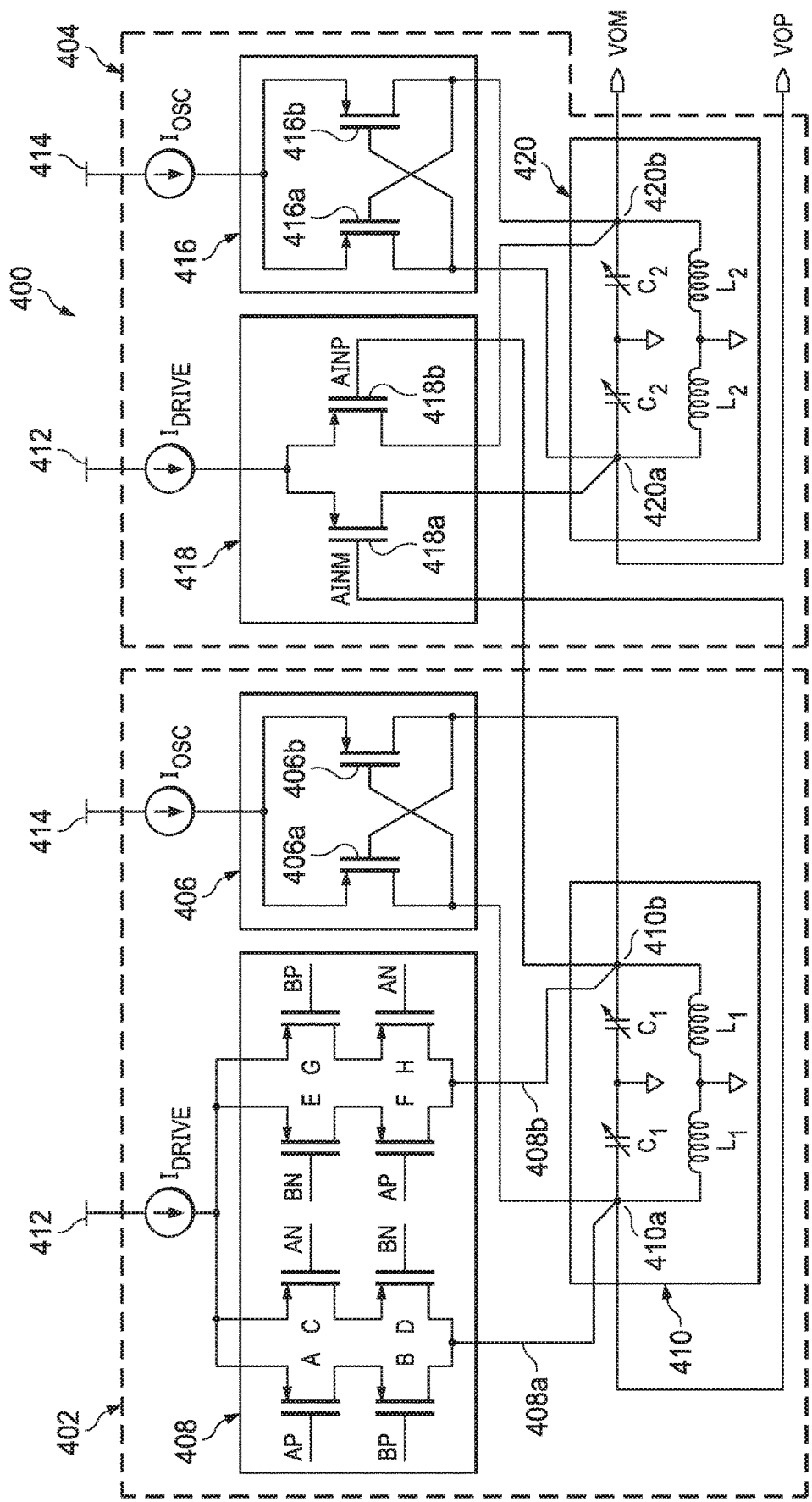
FIG. 4 is a schematic diagram of an illustrative frequency doubler sub-circuit of the clock doubler circuit of FIG. 1 in accordance with various examples.

FIG. 4 is a schematic diagram of an illustrative frequency doubler circuit 400 in accordance with various examples. In an example, the frequency doubler circuit 400 is the frequency doubler circuit 160 of FIG. 1. Frequency doubler circuit 400 includes a first stage frequency waveshaper sub-circuit 402 that is electrically coupled to a second stage frequency waveshaper sub-circuit 404.

In an example, frequency waveshaper sub-circuit 402 includes a PMOS circuit 406, exclusive-OR (XOR) circuit 408, and an LC tank circuit 410. Frequency waveshaper sub-circuit 402 is coupled to nodes 412 and 414. Node 412 receives a direct current (DC) drive current Idrive and node 414 receives a DC oscillator current Iosc, Iosc and Idrive are generated within clock doubler circuit 100 of FIG. 1 or may be provided from an external current source to the clock doubler circuit 100. In an example, Iosc provides a bias current to PMOS transistors 406a, 406b in PMOS circuit 406, and Idrive provides a bias current to PMOS transistors A-H in XOR circuit 408. In an example, a predetermined current ratio of Idrive to Iosc is set to 6:4. Other ratios of Idrive to Iosc may also be used to improve phase performance of output clock signals VOP and VOM.

In an example, PMOS circuit 406 includes a differential pair of PMOS transistors 406a, 406b that are cross-coupled together. For example, the gate terminal of PMOS transistor 406a is coupled to the drain terminal of PMOS transistor 406b, and the gate terminal of PMOS transistor 406b is coupled to the drain terminal of PMOS transistor 406a. The source terminals of each PMOS transistor 406a, 406b are coupled to node 414. The drain terminals of each PMOS transistor 406a, 406b are coupled to LC tank circuit 410. Node 414 receives Iosc and provides a bias current to PMOS transistors 406a, 406b. In an example, drain terminal of PMOS transistor 406a is coupled to node 410a and drain terminal of PMOS transistor 406b is coupled to node 410b. In an example, PMOS circuit 406 and LC tank circuit 410 combine to provide an injection locked voltage controlled oscillator (VCO). The VCO receives Iosc at nodes 410a, 410b to excite the inductors L1 and capacitors C1 so as to generate resonant frequency signals at nodes 410a, 410b. The inductors L1 and capacitors C1 may be selected to generate resonant frequency signals at double clock frequency Fs. In an example, the resonant frequency is output clock signal $F_s$ (for example, double the frequency of clock signal CKIN of FIG. 1). In operation, Iosc from node 414 passes through PMOS transistors 406a, 406b when PMOS transistors 406a and 406b are selectively turned ON by clock signals at nodes 410a and 410b, and Iosc is applied to LC tank circuit 410 at nodes 410a, 410b. The Iosc excites the inductors L1 and capacitors C1 so as to generate a resonant frequency signal at nodes 410a, 410b. In an example, Iosc generates a resonant frequency with the values of the inductors L1 and capacitors C1 forming a frequency selective LC resonant tank circuit 410 and feedback network.

In an example, XOR circuit 408 is connected to duty cycle correction circuits 122 and 150 of FIG. 1. In an example, the XOR circuit 408 includes eight PMOS transistors A-H that are coupled together as common-source transistors. PMOS transistors A-H receive clock signals at their respective gate terminals, from duty cycle correction circuits 122 and 150 to selectively control their operation. In examples, clock signal AP is applied to the gate terminals of PMOS transistors A and F, clock signal BP is applied to the gate terminals of PMOS transistors B and G, clock signal AN is applied to the gate terminals of PMOS transistors C and H, and clock signal BN is applied to the gate terminals of PMOS transistors D and E. Clock signals AP, AN, BP, and BN selectively control PMOS transistors A-H to turn ON or turn OFF according to their respective duty cycles and generate double frequency clock signal Fs as clock signals AINM and AINP at nodes 410a and 410b. Clock signals AINM and AINP at nodes 410a and 410b provide the gate signals to the cross-coupled PMOS transistors 406a and 406b. In an example, PMOS transistors A-H are coupled together in an exclusive-OR configuration. In examples, PMOS transistors A and B are coupled together in series (for example, from left to right, the first series leg) where the drain terminal of PMOS transistor A is coupled to the source terminal of PMOS transistor B, PMOS transistors C and D are coupled together in series (for example, the second series leg) where the drain terminal of PMOS transistor C is coupled to the source terminal of PMOS transistor D, PMOS transistors E and F are coupled together in series (for example, the third series leg) where the drain terminal of PMOS transistor E is coupled to the source terminal of PMOS transistor F, and PMOS transistors G and H are coupled together in series (for example, the fourth series leg) where the drain terminal of PMOS transistor G is coupled to the source terminal of PMOS transistor H. Further, the first series leg is coupled in parallel to the second series leg where the source terminals of PMOS transistors A and C are coupled together and the drain terminals of PMOS transistors B and D are coupled together. Also, the third series leg is coupled in parallel to the fourth series leg where the source terminals of PMOS transistors E and G are coupled together and the drain terminals of PMOS transistors F and H are coupled together. The source terminals of PMOS transistors A, C, E, and G are coupled to node 412, the drain terminals of PMOS transistors B and D are coupled to node 410a, and the drain terminals of PMOS transistors F and H are coupled to node 410b. In an example, XOR circuit 408 receives clock signals AP, AN, BP, and BN and generates double frequency clock signals Fs at nodes 410a and 410b. The VCO generates a resonant frequency that locks onto the double clock frequency signals AINP and AINM at nodes 410a and 410b.

In an example, second stage frequency waveshaper sub-circuit 404 includes a PMOS circuit 416, PMOS circuit 418, and LC tank circuit 420. Second stage frequency waveshaper sub-circuit 404 is coupled to nodes 412 and 414 and receives respective currents Idrive and Iosc. The second stage frequency waveshaper sub-circuit 404 receives output clock signals AINM and AINP and performs filtering on the clock signals AINM and AINP to suppress sub-harmonic $F_s/2$ spurs below 50 dBc.

In an example, PMOS circuit 416 is substantially similar to PMOS circuit 406, and includes a differential pair of PMOS transistors 416a, 416b that are cross-coupled together. For example, the gate terminal of PMOS transistor 416a is coupled to the drain terminal of PMOS transistor 416b, the gate terminal of PMOS transistor 416b is coupled to the drain terminal of PMOS transistor 416a, the source terminals of each PMOS transistor 416a, 416b are coupled to node 414, and the drain terminals of each PMOS transistor 416a, 416b are coupled to LC tank circuit 420. PMOS circuit 416 receives Iosc so as to bias the PMOS transistors 416a, 416b.

In an example, PMOS circuit 418 includes common source PMOS transistors 418a and 418b. PMOS transistors 418a and 418b receive clock signals AINM, AINP from first stage frequency waveshaper sub-circuit 402 at their respective gate terminals. In examples, clock signal AINM is applied to the gate terminal of PMOS transistor 418a and clock signal AINP is applied to the gate terminal of PMOS transistor 418b. Clock signals AINM and AINP may selectively control PMOS transistors 418a, 418b to turn ON and turn OFF according to the respective duty cycles of clock signals AINM, AINP. PMOS circuits 418 and 416 are coupled to LC tank circuit 420. LC tank circuit 420 and PMOS circuit 416 combine to provide an injection locked VCO. VCO receives Iosc at nodes 420a, 420b to generate a resonant frequency at nodes 420a and 420b using the excitation currents of inductors L2 and capacitors C2. In an example, the values of inductors L1 of LC tank circuit 410 are the same value as inductors L2 in LC tank circuit 420, and the values of the capacitors C1 of LC tank circuit 410 are the same value as capacitors C2 in LC tank circuit 420.

In operation, frequency waveshaper sub-circuit 402 generates internal clock signals AINM and AINP that are at the frequency of output clock signal $F_s$ (for example, double the frequency of clock signal CKIN of FIG. 1). LC tank circuit 410 is a resonant circuit and includes inductors L1 and capacitors C1 that are connected together. LC tank circuit 410 acts as an electrical resonator and stores energy oscillating at the LC tank 410 resonant frequency. Iosc generates drain currents for the LC tank circuit 410 that cause the LC tank circuit 410 to oscillate at the oscillation frequency determined by the values of inductors (L) and capacitors (C). The resonant frequency is the same frequency as Fs and the VCO locks onto the internal clock signals AINP and AINM. The desired oscillation frequency of the output clock signal ($F_e$) is shown and described above with respect to FIG. 1. The drive current Idrive is configured to lock the oscillation frequency at the output clock signal frequency $F_s$. The ratio between Iosc and Idrive is predetermined (for example at a current ratio of 6:4) to generate an internal $F_s$ frequency AINP, AINM and to control the VCO circuit 406 and 410. In an example, if Idrive is larger than Iosc, the clock signals AINP, AINM have less noise injection from the VCO circuit 406 and better phase noise performance. In an example, the second stage frequency waveshaper sub-circuit 404 receives clock signals AINP and AINP, and outputs clock signals VOP and VOM at the desired frequency $F_s$. The additional stage for the second stage frequency waveshaper sub-circuit 404 provides rejection of $F_s/2$ sub-harmonic spurs while providing an output clock signal $F_s$ as clock signals VOP and VOM that are at double the frequency of the input clock signal CKIN with low phase noise.

Figure 8:
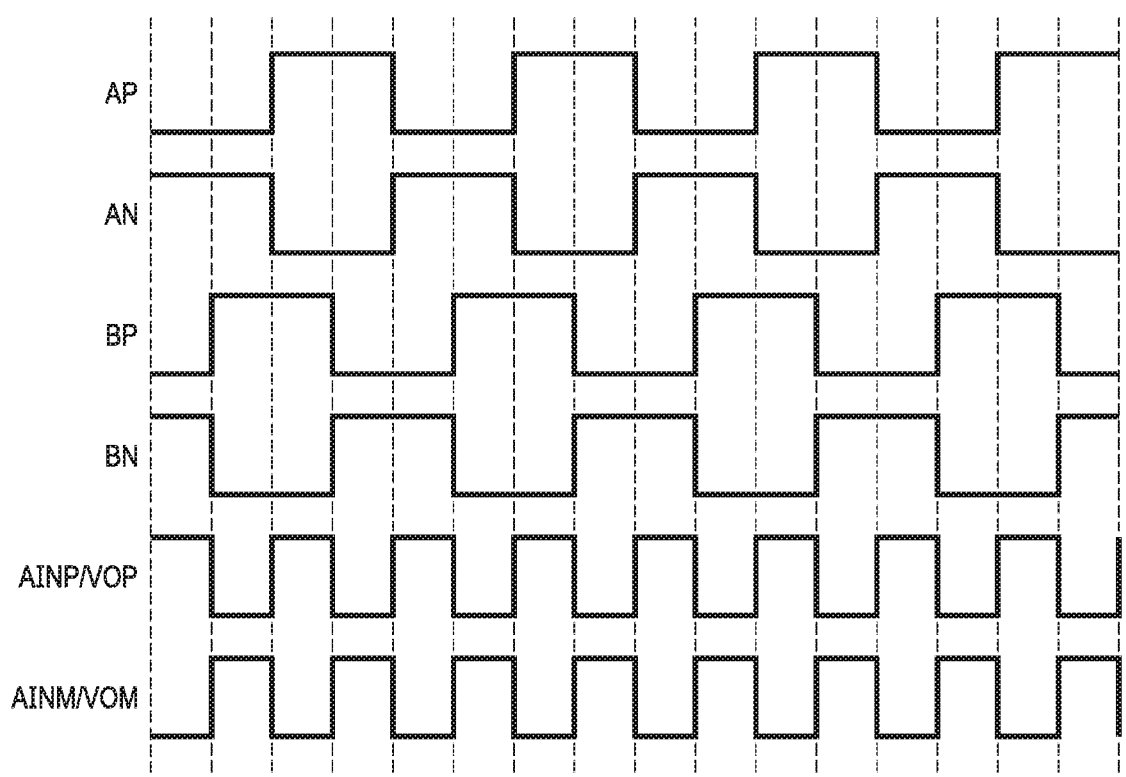
FIG. 8 is an illustrative timing diagram for an illustrative frequency doubler circuit in accordance with various examples.

FIG. 8 is a waveform diagram illustrating operation of the frequency doubler circuit 400 in accordance with various examples. As shown in FIG. 8, clock signals AP, AN, BP, and BN are partially corrected clock signals that are approximately 50% duty cycle. Clock signals AP and AN are 180 degrees out of phase with respect to each other (complementary signals) and clock signals BP and BN are complementary to each other. The VCO receives clock signals AP, AN, BP, and BN and generates internal clock signals AINP and AINM that are double the frequency of AP, AN, BP, and BN (for example, AINP and AINM are at a frequency of output clock signal ($F_s$)). Output clock signal VOP and VOM are complementary clock signals and have a frequency $F_s$ that is double the frequency of the input clock signal CKIN.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:
1. An apparatus for correcting a duty cycle, comprising:
   a first transistor of a first conductivity type having a first drain, a first source, and a first gate;
   a second transistor of the first conductivity type in series with the first transistor, and having a second drain, a second source, and a second gate;
   a third transistor of a second conductivity type having a third drain, a third source, and a third gate;

a fourth transistor of the second conductivity type in series with the third transistor, and having a fourth drain, a fourth source, and a fourth gate;

an input node coupled to the first gate and the third gate, wherein the input node is configured to receive an input clock signal with a first duty cycle;

an output node directly coupled to the second drain and the fourth drain and indirectly coupled to the first drain or the third drain, wherein the output node is configured to generate an output clock signal with a second duty cycle;

a gate node coupled to the second gate and the fourth gate;

a positive voltage supply coupled to a current terminal of the first transistor;

a ground terminal coupled to a current terminal of the third transistor; and a resistor directly coupled to the output node and directly coupled to the gate node.

2. The apparatus of claim 1, wherein the input clock signal is configured to selectively control a pull up drain current through the second transistor and to selectively control a pull down drain current through the fourth transistor.

3. The apparatus of claim 1, wherein the input clock signal is configured to selectively switch ON the first transistor and the third transistor and to selectively switch OFF the first transistor and the third transistor.

4. The apparatus of claim 1, wherein the second duty cycle of the output clock signal is higher than the first duty cycle of the input clock signal when the first duty cycle is less than a 50 percent duty cycle clock signal.

5. The apparatus of claim 4, wherein the second duty cycle of the output clock signal is lower than the first duty cycle of the input clock signal when the first duty cycle is greater than the 50 percent duty cycle clock signal.

6. The apparatus of claim 1, including an inverter coupled to the output node, wherein the inverter is configured to invert the output clock signal.

7. The apparatus of claim 1, wherein the fourth transistor is configured to generate a pull down drain current that is larger than a pull up drain current of the second transistor when the first duty cycle is less than a 50 percent duty cycle.

8. The apparatus of claim 1, wherein the second transistor is configured to generate a pull up drain current that is larger than a pull down drain current of the fourth transistor when the first duty cycle is greater than a 50 percent duty cycle.

* * * * *